United States Patent
Yoshita

(10) Patent No.: US 10,367,026 B2
(45) Date of Patent: Jul. 30, 2019

(54) SOLID-STATE IMAGING ELEMENT, IMAGING DEVICE, AND ELECTRONIC DEVICE

(71) Applicant: SONY CORPORATION, Tokyo (JP)

(72) Inventor: Ryoto Yoshita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/227,088

(22) Filed: Dec. 20, 2018

(65) Prior Publication Data
US 2019/0148449 A1     May 16, 2019

Related U.S. Application Data

(63) Continuation of application No. 15/556,548, filed as application No. PCT/JP2016/056728 on Mar. 4, 2016, now Pat. No. 10,163,964.

(30) Foreign Application Priority Data

Mar. 18, 2015    (JP) ................................. 2015-054326

(51) Int. Cl.
*H01L 27/146*     (2006.01)
*H04N 5/374*     (2011.01)

(52) U.S. Cl.
CPC .. *H01L 27/14643* (2013.01); *H01L 27/14603* (2013.01); *H01L 27/14612* (2013.01); *H01L 27/14623* (2013.01); *H01L 27/14638* (2013.01); *H04N 5/374* (2013.01)

(58) Field of Classification Search
CPC ......... H01L 27/14643; H01L 27/14612; H01L 27/14638
See application file for complete search history.

(56) References Cited

U.S. PATENT DOCUMENTS

| | | |
|---|---|---|
| 2004/0263657 A1 | 12/2004 | Sakamoto et al. |
| 2011/0248371 A1 | 10/2011 | Matsumura et al. |
| 2014/0239155 A1 | 8/2014 | Ohkubo |

FOREIGN PATENT DOCUMENTS

| | | |
|---|---|---|
| CN | 102214669 A | 10/2011 |
| CN | 104009051 A | 8/2014 |
| JP | 2001-057423 A | 2/2001 |
| JP | 2011-222708 A | 11/2011 |

(Continued)

OTHER PUBLICATIONS

International Search Report and Written Opinion of PCT Application No. PCT/JP2016/056728, dated Apr. 19, 2016, 08 pages of English translation and 07 pages of ISRWO.

(Continued)

*Primary Examiner* — Errol V Fernandes
(74) *Attorney, Agent, or Firm* — Chip Law Group

(57) ABSTRACT

The present technology relates to a solid-state imaging element, an imaging device, and an electronic device that can improve transfer efficiency of a charge accumulation unit (MEM) and can increase the number of saturation electrons Qs. In a case where a charge voltage conversion unit (FD) is connected to a center of a charge accumulation unit (MEM) in each pixel and pixels are arrayed in an array, a column in which photoelectric conversion units (PD) are arrayed and a column including charge voltage conversion units (FD) and pixel transistors are arrayed in parallel. The present technology can be applied to a CMOS image sensor.

10 Claims, 11 Drawing Sheets

(56) References Cited

FOREIGN PATENT DOCUMENTS

| JP | 2013-254805 A | 12/2013 |
|----|---------------|---------|
| JP | 2014-165270 A | 9/2014  |

OTHER PUBLICATIONS

Notice of Allowance and Fees Due for U.S. Appl. No. 15/556,548, dated Aug. 27, 2018, 07 pages.
Final Rejection for U.S. Appl. No. 15/556,548, dated Jun. 4, 2018, 10 pages.
Non-Final Rejection for U.S. Appl. No. 15/556,548, dated Feb. 5, 2018, 09 pages.
International Preliminary Report on Patentability of PCT Application No. PCT/JP2016/056728, dated Sep. 28, 2017, 08 pages of English Translation and 05 pages of IPRP.

SOLID-STATE IMAGING ELEMENT, IMAGING DEVICE, AND ELECTRONIC DEVICE

CROSS-REFERENCE TO RELATED APPLICATION

The present application is a continuation application of U.S. patent application Ser. No. 15/556,548, filed Sep. 7, 2017, which is a national stage entry of PCT/JP2016/056728, filed Mar. 4, 2016, which claims priority from prior Japanese Priority Patent Application JP 2015-054326 filed in the Japan Patent Office on Mar. 18, 2015, the entire contents of which are hereby incorporated by reference.

TECHNICAL FIELD

The present technology relates to a solid-state imaging element, an imaging device, and an electronic device and specifically relates to a solid-state imaging element, an imaging device, and an electronic device that can improve charge transfer efficiency and increase the number of saturation electrons Qs.

BACKGROUND ART

Conventionally, a complementary metal oxide semiconductor (CMOS) image sensor (CIS) in which a photoelectric conversion unit (photodiode: PD), a charge accumulation unit (MEM), a floating diffusion (FD), and a pixel Tr. (transistor) are formed in an own pixel region and a pixel array is formed has been proposed (see Patent Document 1).

In such a complementary metal oxide semiconductor (CMOS) image sensor (CIS) including a charge accumulation unit (MEM) in a pixel, the charge accumulation unit (MEM) is arranged in an own pixel region, and a change accumulated in the charge accumulation unit (MEM) is transferred to a charge voltage conversion unit (floating diffusion: FD).

CITATION LIST

Patent Document

Patent Document 1: Japanese Patent Application Laid-Open No. 2013-254805

SUMMARY OF THE INVENTION

Problems to be Solved by the Invention

However, in the above-described conventional art, in a case where a charge accumulation unit (MEM) is arranged in an own pixel region and a charge voltage conversion unit (FD) is arranged in a manner of being connected to a position other than a center of the charge accumulation unit (MEM), a transfer distance from an outer peripheral part of the charge accumulation unit (MEM) to the charge voltage conversion unit (FD) becomes long, and there is a possibility that a transfer characteristic is deteriorated.

Also, it is necessary to increase the number of masks of an implant and to form a sufficient potential gradient in order to perform a good transfer for a long transfer distance. Thus, the number of masks and the number of times of implantation are increased and a man-hour is increased.

Furthermore, it is not possible to make a potential deep in an outer peripheral part of the charge voltage conversion unit (FD) concerning a transfer gradient. Thus, the number of saturation electrons in a unit area is decreased as a transfer distance becomes long.

The present technology is provided in view of such a situation and is specifically to improve charge transfer efficiency and to increase the number of saturation electrons Qs.

Solutions to Problems

A solid-state imaging element of an aspect of the present technology includes: a pixel including a photoelectric conversion unit that generates a charge by photoelectric conversion according to an amount of incident light, a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

A plurality of electrodes that forms a transfer gradient to transfer the charge accumulated in the charge accumulation unit is further included, in which a recess is provided at a center of each of the plurality of electrodes in such a manner as to face the charge voltage conversion unit, an electrode in an outermost periphery being formed in such a manner as to surround, in the recess, a different electrode smaller than the electrode in the outermost periphery, the different electrode being formed in such a manner as to surround, in the recess, a different electrode smaller than the different electrode, and an electrode connected to the charge voltage conversion unit being formed in the recess of the smallest electrode.

The thicknesses of the plurality of electrodes may be even.

The thicknesses of the plurality of electrodes may be uneven.

The plurality of electrodes may be configured with a small number of thick electrodes as a margin in the transfer gradient in the charge accumulation unit becomes large, and may be configured with a large number of thin electrodes as the transfer gradient becomes insufficient.

An imaging device of an aspect of the present technology includes: a pixel including a photoelectric conversion unit that generates a charge by photoelectric conversion according to an amount of incident light, a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

An electronic device of an aspect of the present technology includes: a pixel including a photoelectric conversion unit that generates a charge by photoelectric conversion according to an amount of incident light, a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

One aspect of the present technology includes a pixel in which a charge is generated by photoelectric conversion by a photoelectric conversion unit according to an amount of incident light, the charge generated by the photoelectric conversion unit is accumulated by a charge accumulation unit, the charge accumulated in the charge accumulation unit is converted into voltage by a charge voltage conversion unit, and a pixel signal is output by a pixel transistor on the basis of the voltage converted by the charge voltage conversion unit. In a case where the charge voltage conversion unit is connected to a center of the charge accumulation unit and pixels are arrayed in an array, a column including photoelectric conversion units and a column including voltage conversion units and pixel transistors are formed in parallel.

Effects of the Invention

According to one aspect of the present technology, it becomes possible to improve charge transfer efficiency and to increase the number of saturation electrons Qs.

BEST MODE FOR CARRYING OUT THE INVENTION

In the following, an example of the best mode for carrying out the present invention will be described. However, the present invention is not limited to the following example.

<Configuration Example of Pixel of General Solid-State Imaging Element>

Figure 1:
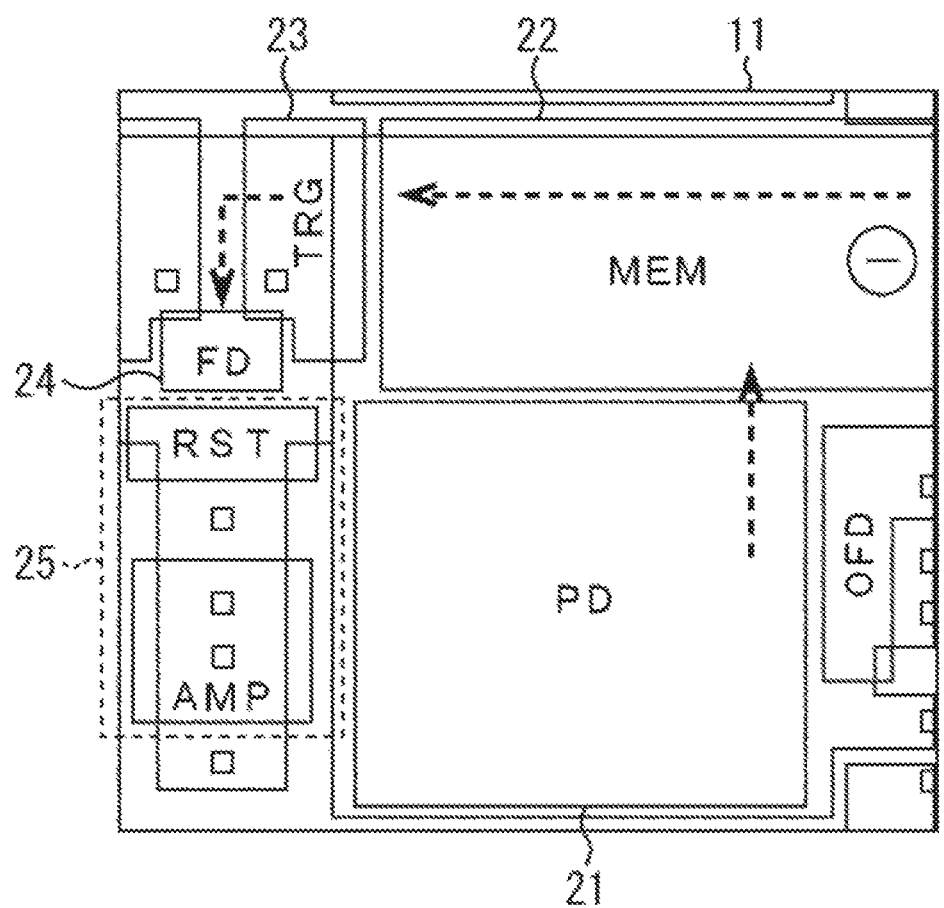
FIG. 1 is a view for describing a configuration of a pixel of a general solid-state imaging element.

FIG. 1 is a view illustrating a configuration example of a pixel in a general solid-state imaging element including a complementary metal oxide semiconductor (CMOS) image sensor (CIS).

A pixel 11 in FIG. 1 includes a photoelectric conversion unit (photodiode: PD) 21, a charge accumulation unit (MEM) 22, a transfer transistor (TRG) 23, a charge voltage conversion unit (floating diffusion: FD) 24, and a pixel transistor (reset transistor RST and amplification transistor AMP) 25. Note that FIG. 1 is a top view of a pixel.

As illustrated in FIG. 1, in the drawing, the charge accumulation unit (MEM) 22 is arranged on the photoelectric conversion unit (PD) 21, the charge voltage conversion unit (FD) 24 is provided on a left side thereof, and a charge is transferred via the transfer transistor (TRG) 23 in a layout of the pixel 11.

With such a configuration, as indicated with an upward arrow, charges generated according to the amount of incident light in the photoelectric conversion unit (PD) 21 are transferred to the charge accumulation unit (MEM) 22 and serially accumulated. Then, the charges accumulated in the charge accumulation unit (MEM) 22 are transferred to the charge voltage conversion unit (FD) 24 via the transfer transistor (TRG) 23 as indicated by an arrow in a left direction.

Here, since the charge accumulation unit (MEM) 22 is arranged in an own pixel region and the charge voltage conversion unit (FD) 24 is arranged at a position other than a center of the charge accumulation unit (MEM) 22, a transfer distance, for example, from a right end part of the charge accumulation unit (MEM) 22 in the drawing to the charge voltage conversion unit (FD) 24 becomes long.

Figure 2:
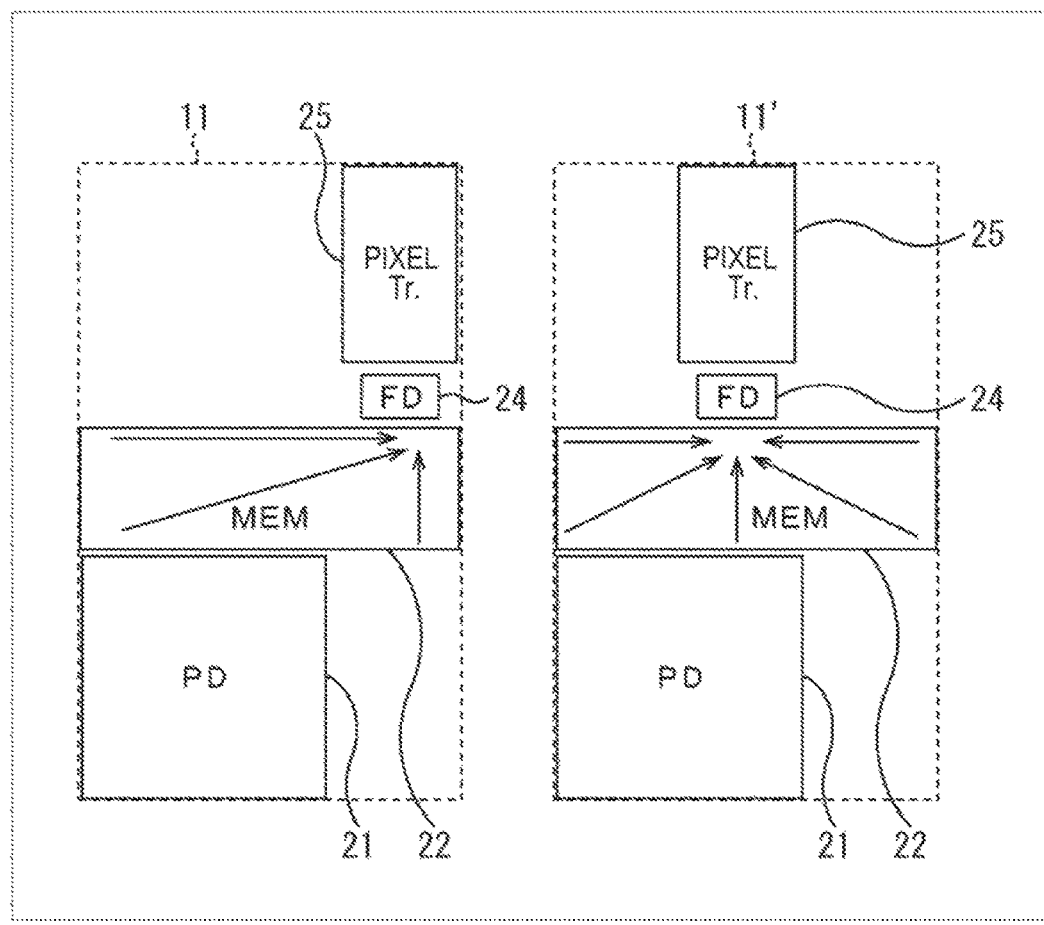
FIG. 2 is a view for describing a configuration of a pixel transfer efficiency of which is improved as compared with that of the pixel in FIG. 1.

That is, as illustrated in a left part of FIG. 2, in a case where the charge voltage conversion unit (FD) 24 is provided at an upper right of the charge accumulation unit (MEM) 22, it is necessary to move the longest distance indicated by an arrow from a lower left to the upper right of the charge accumulation unit (MEM) 22. Thus, there is a possibility that a transfer characteristic is deteriorated.

Note that in the left part of FIG. 2, the charge voltage conversion unit (FD) 24 is connected to the upper right part of the charge accumulation unit (MEM) 22, the pixel transistor 25 is provided at an upper of the charge voltage conversion unit (FD) 24 in the drawing, and the photoelectric conversion unit (PD) 21 is provided at the lower left part of the charge accumulation unit (MEM) 22. Since such a pixel 11 on the left part of FIG. 2 are arranged in an array, a column in which photoelectric conversion units 21 are provided and a column in which pixel transistors 25 are provided can be in parallel in a vertical direction. Thus, photoelectric conversion units (PD) 21 can be arranged in a grid.

In a case of such a configuration, it is considered to increase the number of masks of an implant and to form a sufficient transfer gradient (potential gradient) in order to perform a good transfer for a long transfer distance of the charge accumulation unit (MEM) 22.

However, in this case, the number of masks and the number of times of implantation are increased and a man-hour is increased. Also, concerning a transfer gradient, it is not possible to form a potential deeply in a part of the charge accumulation unit (MEM) 22 which part is the farthest from a part where the charge voltage conversion unit (FD) 24 is connected. Thus, the number of saturation electrons in a unit area is decreased markedly as a transfer distance becomes long.

Thus, in order to reduce deterioration of a transfer characteristic, a layout of shortening the longest transfer distance in the charge accumulation unit (MEM) 22 to the charge voltage conversion unit (FD) 24 by connecting the charge voltage conversion unit (FD) 24 to an upper center of the charge accumulation unit (MEM) 22 is considered as indicated by a pixel 11' on a right side of FIG. 2.

That is, as illustrated in the right part of FIG. 2, a position of the charge voltage conversion unit (FD) 24 is arranged at the upper center of the charge accumulation unit (MEM) 22, whereby the transfer distance in the charge accumulation unit (MEM) 22 becomes a distance from a lower end part in a horizontal direction to the upper center at the longest. Thus, it is possible to shorten the transfer distance as a whole and to control reduction of the transfer characteristic. However, in this case, as illustrated in FIG. 3, in a case of arranging a plurality of pixels 11' in an array on a plane, it is not possible to make a column in which photoelectric conversion units (PD) 21 are provided and a column, in which pixel transistors 25 are provided, to be columns in a vertical direction.

Figure 3:
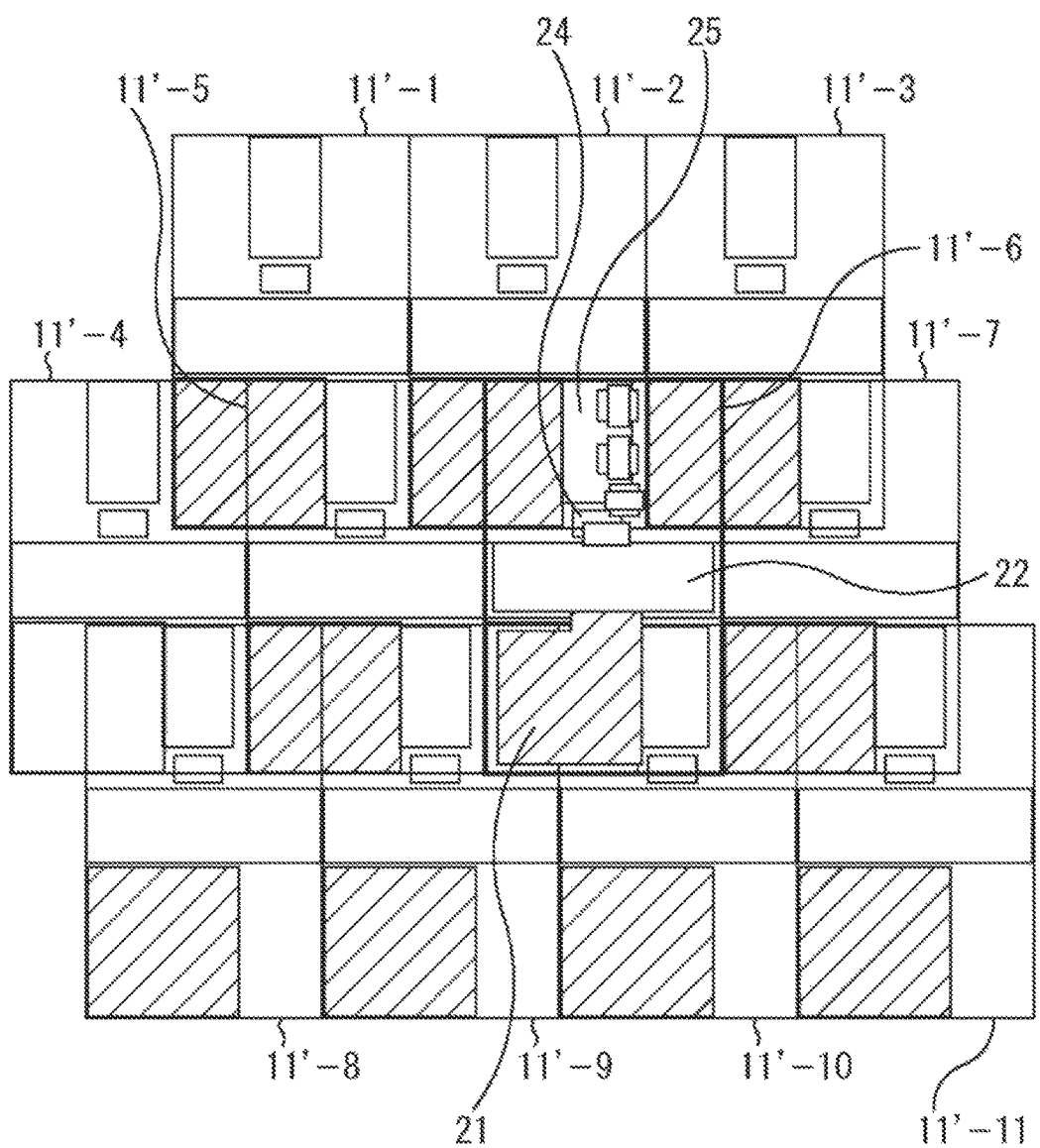
FIG. 3 is a view for describing a configuration in a case where pixels in FIG. 2 are arranged in an array.

That is, an example in which pixels 11'-1 to 11'-11 are serially arrayed is illustrated in FIG. 3. A column in which photoelectric conversion units (PD) 21 are provided and a column in which charge voltage conversion units (FD) 24 and pixel transistors 25 are provided cannot be formed in parallel with the vertical direction and the photoelectric conversion units (PD) 21 cannot be arranged regularly. Thus, a pixel layout including a wiring line becomes complicated.

<Configuration Example of Pixel of Solid-State Imaging Element to which Present Technology is Applied>

Figure 4:
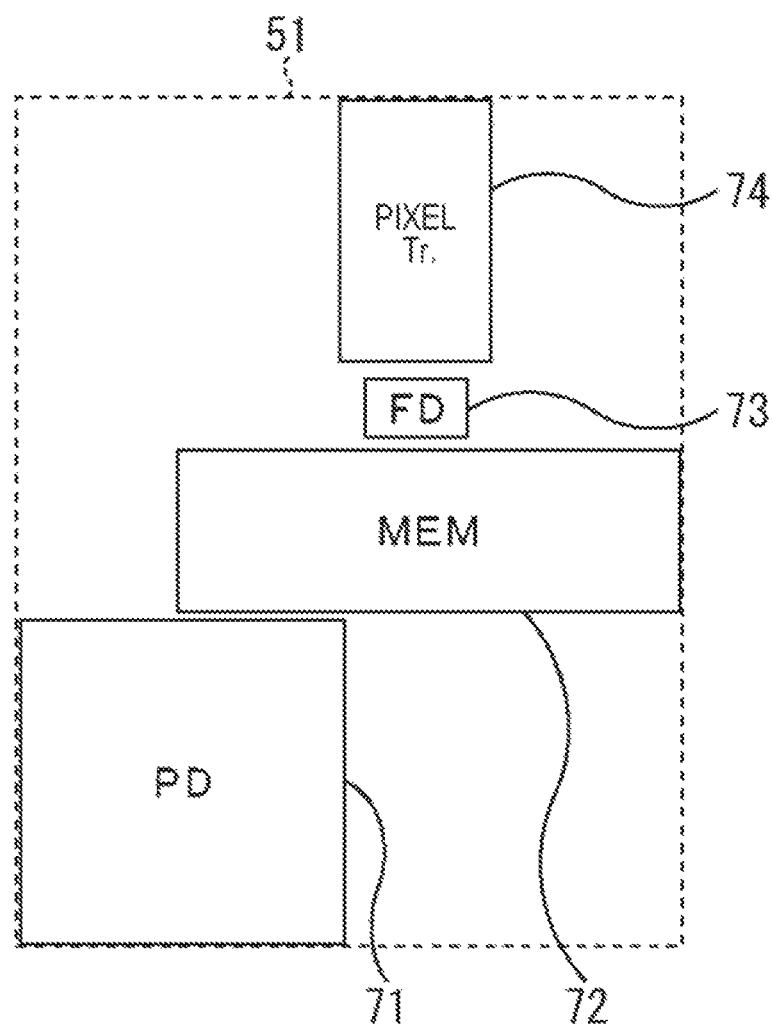
FIG. 4 is a view for describing a configuration example of one embodiment of a pixel of a solid-state imaging element to which the present technology is applied.

Next, a configuration example of a pixel of a solid-state imaging element to which the present technology is applied will be described with reference to FIG. 4. As illustrated in FIG. 4, a pixel 51 to which the present technology is applied includes a photoelectric conversion unit (PD) 71, a charge accumulation unit (MEM) 72, a charge voltage conversion unit (FD) 73, and a pixel transistor (pixel Tr.) 74. Note that the photoelectric conversion unit (PD) 71, the charge accumulation unit (MEM) 72, the charge voltage conversion unit (FD) 73, and the pixel transistor (pixel Tr.) 74 respectively correspond to the photoelectric conversion unit (PD) 21, the charge accumulation unit (MEM) 22, the charge voltage conversion unit (FD) 24, and the pixel transistor (pixel Tr.) 25 in FIG. 2.

As illustrated in FIG. 4, the charge voltage conversion unit (FD) 73 is connected to an upper center of the charge accumulation unit (MEM) 72 in the pixel 51. Thus, since the longest one among transfer distances of charges accumulated in the charge accumulation unit (MEM) 72 to the charge voltage conversion unit (FD) 73 can be minimized, it becomes possible to control reduction in transfer efficiency.

Figure 6:
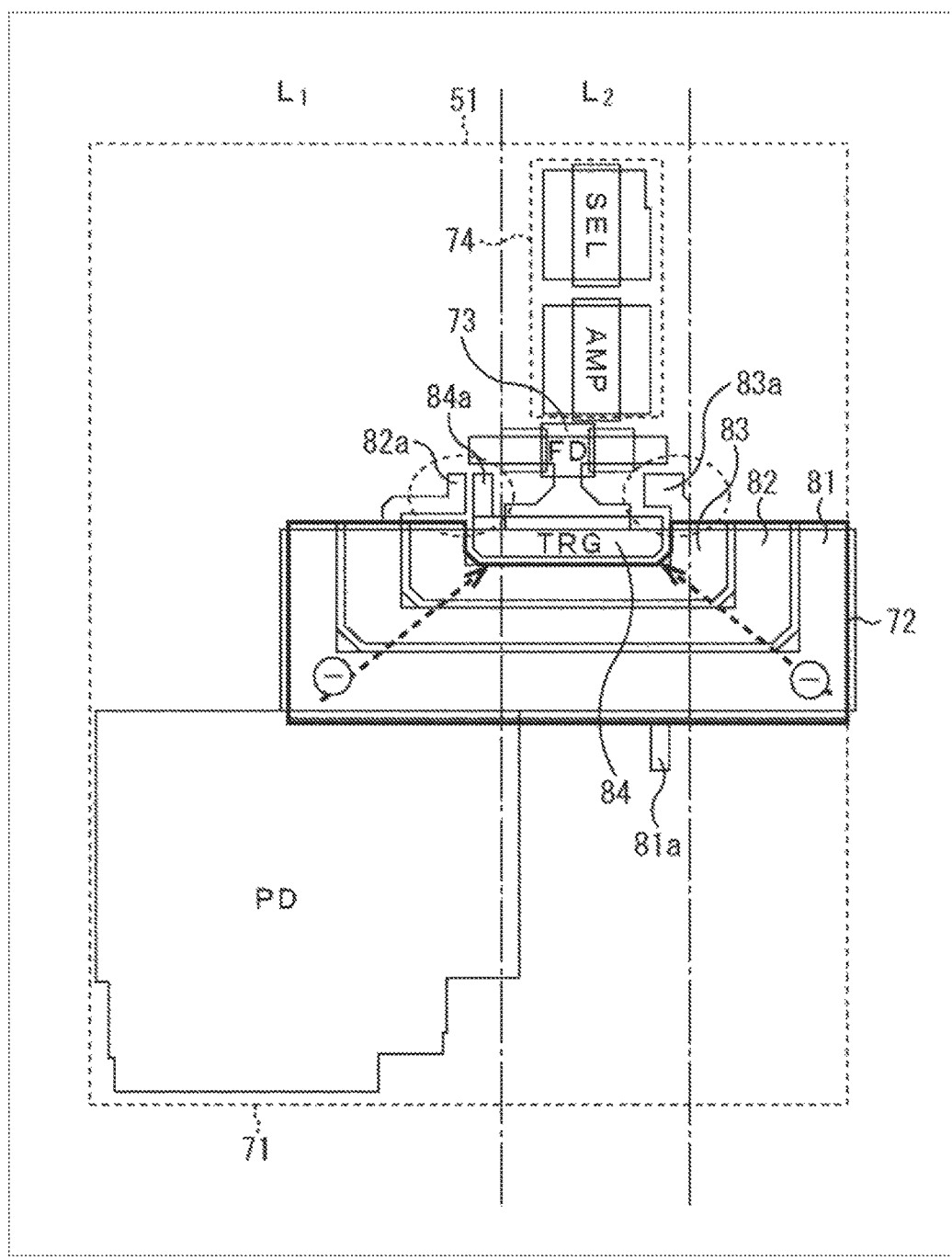
FIG. 6 is a view for describing a configuration example of a charge accumulation unit.

Note that a transfer transistor 84 (FIG. 6) is provided between the charge accumulation unit (MEM) 72 and the charge voltage conversion unit (FD) 73. Charges accumulated in the charge accumulation unit (MEM) 72 are transferred to the charge voltage conversion unit (FD) 73 via this transfer transistor 84 (FIG. 6).

Furthermore, the photoelectric conversion unit (PD) 71 and the charge accumulation unit (MEM) 72 are connected in a positional relationship in which the photoelectric conversion unit (PD) 71, the charge voltage conversion unit (FD) 73, and the pixel transistor (pixel Tr.) 74 are not overlapped in the vertical direction.

Figure 5:
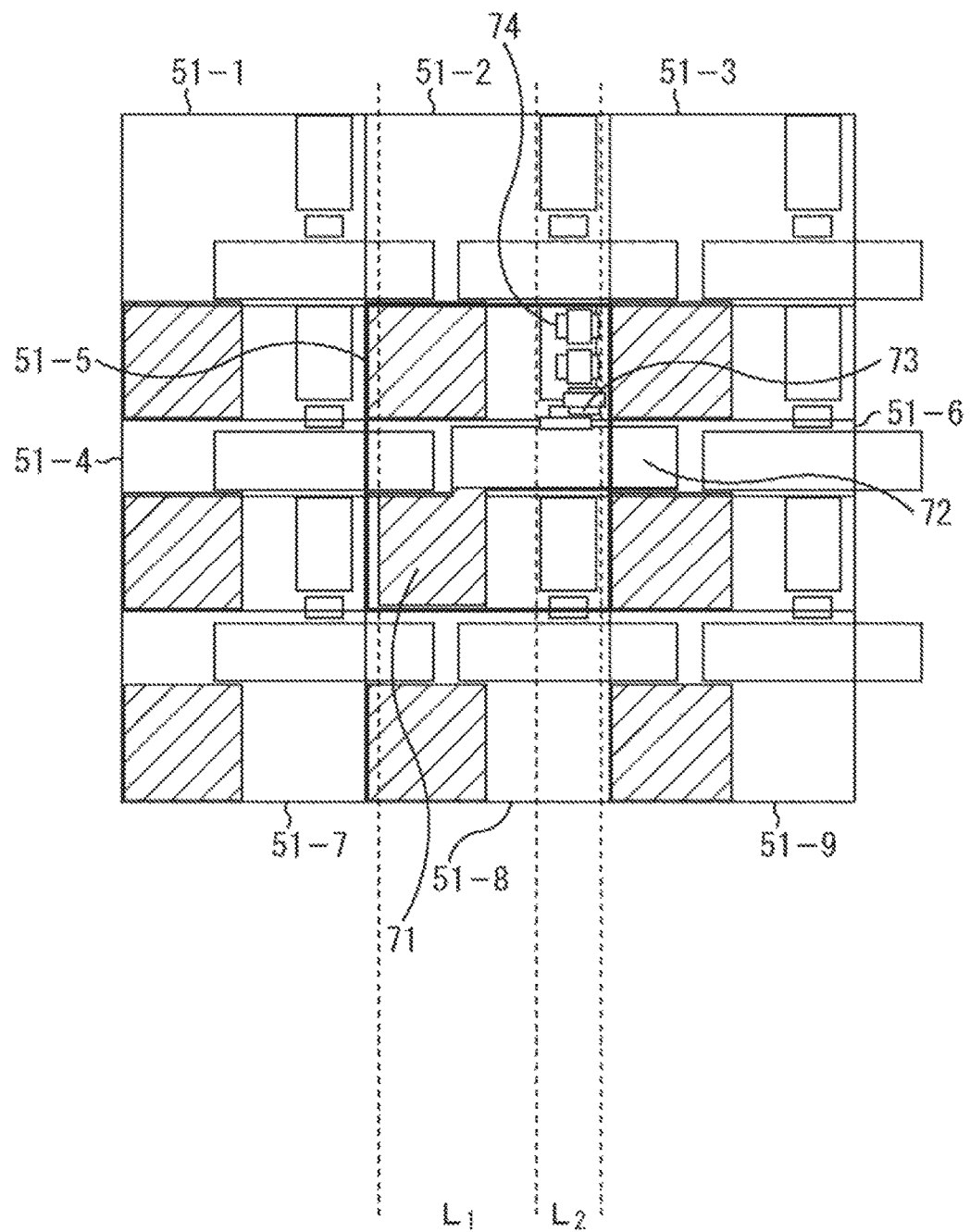
FIG. 5 is a view for describing a configuration in a case where pixels in FIG. 4 are arranged in an array.

With such a configuration, a plurality of pixels 51 can be arrayed in such a manner that photoelectric conversion units (PD) are in an array in a horizontal direction and a vertical direction as illustrated in FIG. 5. A pixel 51-5 in FIG. 5 is arranged in such a manner that a photoelectric conversion unit (PD) 71 of a pixel 51-2 thereabove is fit in a space at an upper left of a charge accumulation unit (MEM) 72. Also, the arrangement is performed in such a manner that a charge voltage conversion unit (FD) 73 and a pixel transistor (Tr.) 74 of a pixel 51-8 thereunder are fit in a space at a lower right of the charge accumulation unit (MEM) 72 of the pixel 51-5. Furthermore, the arrangement is performed in such a manner that a part, which is protruded to a right side, of the charge accumulation unit (MEM) 72 of the pixel 51-5 adjacent on a left side is fit in a space at a left end part of the charge accumulation unit (MEM) 72 of the pixel 51-5. Also, the arrangement is performed in such a manner that a part, which is protruded to the right side, of the charge accumulation unit (MEM) 72 of the pixel 51-5 is fit in a space at a left end part of a charge accumulation unit (MEM) 72 of a pixel 51-6 adjacent on the right side.

The other pixels 51 are arranged similarly, whereby the photoelectric conversion units (PD) 71 of the pixels 51 can be arranged in an array.

As illustrated in FIG. 4, since the pixels 51 are arranged in an array, a column L1 including the photoelectric conversion units (PD) 71, and a column L2 including the charge voltage conversion units (FD) 73 and the pixel transistors (pixel Tr.) 74 are configured as columns in parallel in the vertical direction.

As a result, as indicated by the pixels 51-1 to 51-9 in FIG. 5, the photoelectric conversion units (PD) 71 of three pixels×three pixels can be regularly laid out in a grid. Also, since it becomes possible to configure a wiring line along each of the columns L1 and L2 of the column L1 including the photoelectric conversion units (PD) 71 and the column L2 including the charge voltage conversion units (FD) 73 and the pixel transistors (pixel Tr.) 74, it becomes possible to simplify routing of the wiring line.

<Configuration of Electrode to Transfer Charge of Charge Accumulation Unit (MEM)>

Next, a configuration of an electrode that transfers a charge of the above-described charge accumulation unit (MEM) 72 will be described with reference to FIG. 6. That is, as illustrated in FIG. 6, an electrode that transfers a charge of the charge accumulation unit (MEM) 72 has a configuration in which box-shaped electrodes 81 to 83 with a recess being provided at an upper part from a lower part in the drawing. An electrode of the transfer transistor 84 is provided in the recess of the smallest electrode 83, which is laminated on the uppermost part and is provided with the smallest recess, and connection to the charge voltage conversion unit (FD) 73 is made via this transfer transistor 84. Note that FIG. 6 is a top view of the pixel 51, the electrodes 81 to 83 of the charge accumulation unit (MEM) 72 and the transfer transistor 84 being expressed in a sectional view seen in a top surface direction.

That is, each of the electrodes 81 to 83 is a box-shaped electrode with a recess being provided on an upper side in the drawing. The electrode 82 is laminated in the recess of the electrode 81, the electrode 83 is laminated in the recess of the electrode 82, and the electrode of the transfer transistor 84 is laminated in the recess of the electrode 83. The plurality of electrodes that transfers a charge of the charge accumulation unit (MEM) 72 is formed in a square shape as a whole. In other words, the electrodes 81 to 83 that transfer a charge of the charge accumulation unit (MEM) 72, and the transfer transistor 84 have a configuration in which the electrodes 81 to 83 are concentrically laminated with a center being an upper center to which the charge voltage conversion unit (FD) 73 that is a transfer direction of a charge is connected.

With such a configuration, it becomes possible to configure a transfer gradient in each of the electrodes 81 to 83. Thus, it becomes possible to increase the number of saturation electrons Qs as compared with a case where electrodes 81 to 83 are one electrode as a whole.

Figure 7:
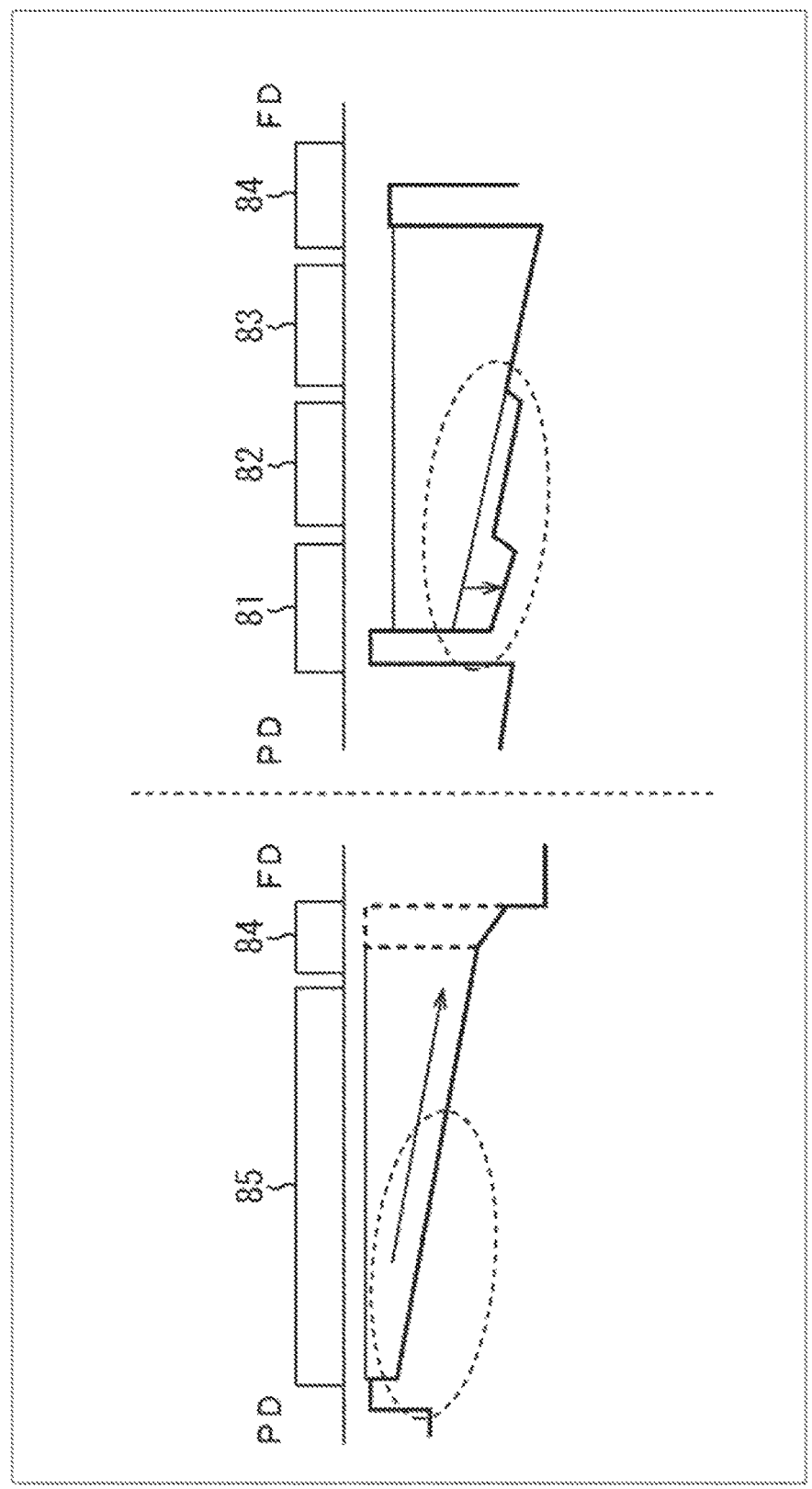
FIG. 7 is a view for describing that the amount of saturation electrons can be increased.

That is, in a case where a charge accumulation unit (MEM) 72 as a whole is one electrode 85, it is necessary to set a transfer gradient for a whole charge transfer distance as illustrated in a left part of FIG. 7. Thus, it is necessary to set the shallowest potential and the deepest potential respectively at both ends of the electrode 85 and to form a transfer gradient. As a result, in a case where the charge accumulation unit (MEM) 72 as a whole is configured by the one electrode 85, an area of an upper part of a transfer gradient in a waveform illustrated in the left part of FIG. 7 is expressed as the number of saturation electrons Qs.

On the other hand, in a case where the charge accumulation unit (MEM) 72 has a laminated structure as indicated by the electrodes 81 to 83 in FIG. 6, it is possible to set a transfer gradient in each of the electrodes 81 to 83 as illustrated in a right part of FIG. 7. Accordingly, as indicated by an arrow in the right part of FIG. 7, it is possible to set a transfer gradient while serially performing switching at a deep potential in each of the electrodes 81 to 83. As a result, as illustrated in the right part of FIG. 7, it becomes possible to increase the number of saturation electrons Qs expressed as an area of an upper part of a transfer gradient compared with a case illustrated in the left part of FIG. 7.

Note that a potential distribution between electrodes in a case where a transfer gradient of the charge accumulation unit (MEM) 72 is configured by the one electrode 85 is illustrated in the left part of FIG. 7. More specifically, a potential distribution in the photoelectric conversion unit (PD) 71, the electrode 85, the transfer transistor 84, and the charge voltage conversion unit (FD) 73 is illustrated from the left in the left part of FIG. 7. In the left part of FIG. 7, since the transfer gradient is configured only by the electrode 85, both end parts are respectively set as the shallowest potential and the deepest potential. Thus, the potential distribution is monotonically decreased.

Similarly, a potential distribution between electrodes in a case where a transfer gradient of the charge accumulation unit (MEM) 72 is configured by the electrodes 81 to 83 is illustrated in the right part of FIG. 7. More specifically, a potential distribution in the photoelectric conversion unit (PD) 71, the electrodes 81 to 83, the transfer transistor 84, and the charge voltage conversion unit (FD) 73 is illustrated from the left in the right part of FIG. 7. In the right part of FIG. 7, since a transfer gradient can be configured in each of the electrodes 81 to 83 and the transfer transistor 84, it becomes possible to set the transfer gradient at each deep potential. Thus, a potential distribution in which an increase and decrease are repeated in a deep part in each of positions corresponding to the electrodes 81 to 83 is acquired.

Also, in a case where the charge accumulation unit (MEM) 72 has a laminated structure including the electrodes 81 to 83 illustrated in FIG. 6, terminals 81a to 83a respectively connected to the electrodes 81 to 83 can be intensively provided on a column L2 (see FIG. 5) including charge voltage conversion units (FD) 73 and pixel transistors (Tr.) 74. Accordingly, it becomes possible to enhance an effect of a light shielding film to prevent incidence to the charge accumulation unit (MEM) 72.

Figure 8:
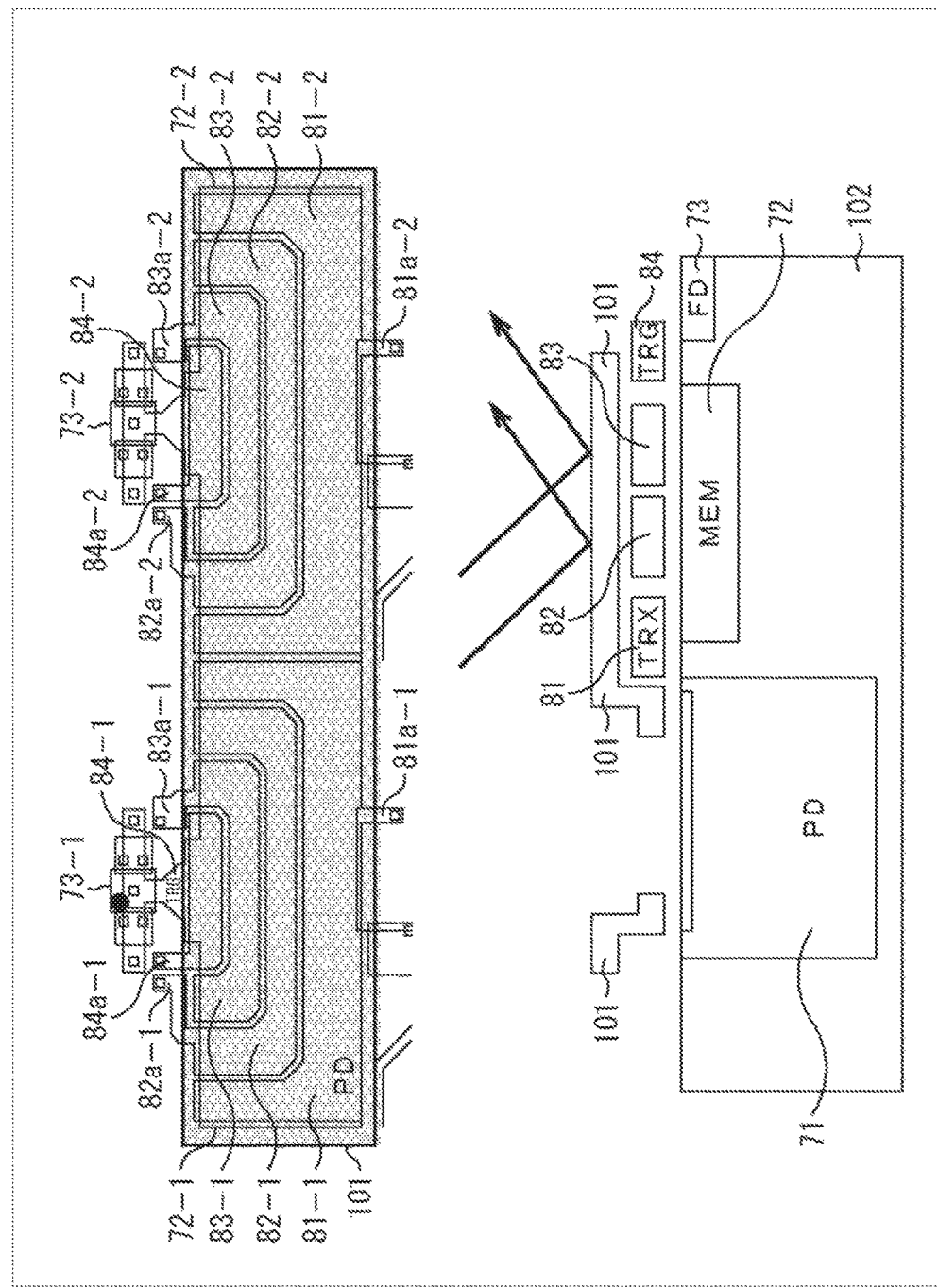
FIG. 8 is a view for describing a configuration of a light shielding film in the pixel in FIG. 4.

That is, as illustrated in FIG. 8, a light shielding film 101 is provided in the charge accumulation unit (MEM) 72 in order to avoid direct incidence of incident light. More specifically, as illustrated in an upper part of FIG. 8, this light shielding film 101 is provided in such a manner as to cover the whole charge accumulation unit (MEM) 72. As illustrated in a lower part of FIG. 8, this light shielding film 101 is provided to cover the charge accumulation unit (MEM) 72, an opening being provided and incidence of incident light being received in an upper part of the photoelectric conversion unit (PD) 71.

Note that a top view of charge accumulation units (MEM) 72 in two pixels 51 is illustrated in the upper part of FIG. 8. It is illustrated that electrodes 81-1 to 83-1, a transfer transistor 84-1, terminals 81a-1 to 83a-1, and a charge voltage conversion unit (FD) 73-1 are provided in the pixel 51 on the left side. Also, it is illustrated that electrodes 81-2 to 83-2, a transfer transistor 84-2, terminals 81a-2 to 83a-2, and a charge voltage conversion unit (FD) 73-2 are provided in the pixel 51 on the right side. Then, in the upper part of FIG. 8, a light shielding film 101 colored to cover the whole electrodes 81-1 to 83-1 and electrodes 81-2 to 83-2 is expressed.

Also, a side sectional view of one pixel 51 is illustrated in the lower part of FIG. 8. It is illustrated that a photoelectric conversion unit (PD) 71, a charge accumulation unit (MEM) 72, and a charge voltage conversion unit (FD) 73 are provided from the left on a substrate 102. Also, it is illustrated that electrodes 81 to 83 are provided and a transfer transistor 84 is provided on the charge accumulation unit (MEM) 72 serially from a side of the photoelectric conversion unit (PD) 71. Furthermore, it is illustrated that the electrodes 81 to 83 are provided, and the light shielding film 101 is provided to cover the transfer transistor 84.

Figure 9:
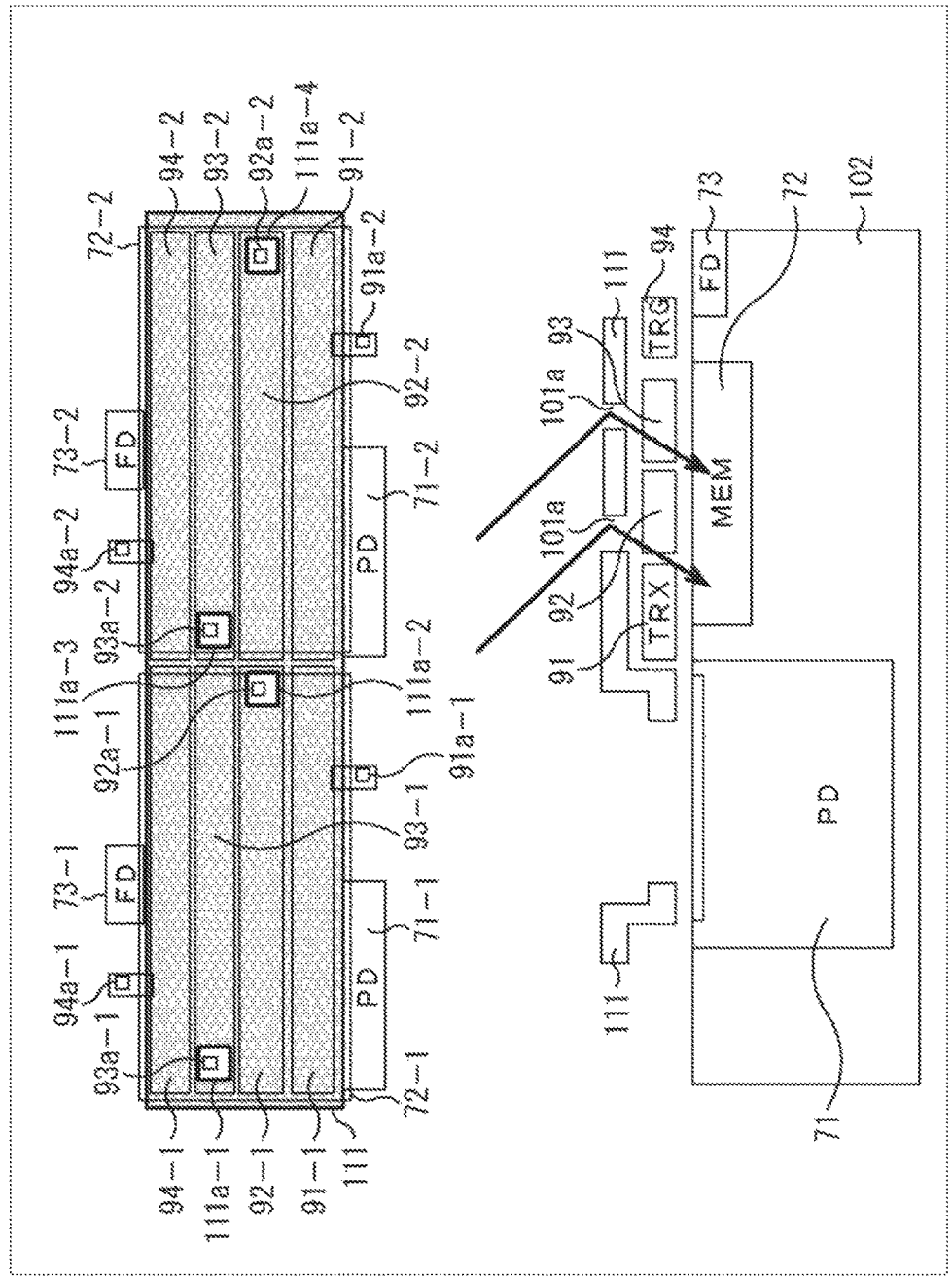
FIG. 9 is a view for describing a configuration of a light shielding film in a case where an electrode of the charge accumulation unit has a plate shape without a recess at a center.

On the other hand, in a case where an electrode shape for setting a transfer gradient in a charge accumulation unit (MEM) 72 is not the above-described configuration in which a recess is provided at a center and lamination is performed but is, for example, a structure such as electrodes 91 to 93 and a transfer transistor 94 that are laminated in a plate-like manner as illustrated in an upper part of FIG. 9, terminals 91a to 94a from the electrodes 91 to 93 and the transfer transistor 94 are provided.

Here, as illustrated in the upper part of FIG. 9, a light shielding film 111 is also formed on the charge accumulation unit (MEM) 72. In this case, the terminals 92a and 93a cannot be connected to a different wiring line if being covered with the light shielding film 111. Thus, an opening 111a is provided in the light shielding film 111 in order to realize electrical connection of a wiring line at the terminals 92a and 93a.

Thus, as illustrated in a lower part of FIG. 9, there is a possibility that incident light enters from the opening 111a, reaches the charge accumulation unit (MEM) 72, and generates a noise in the charge accumulation unit (MEM) 72 in which a charge transferred from a photoelectric conversion unit (PD) is originally accumulated.

Accordingly, electrodes with a recess being provided at a center, such as the electrodes 81 to 83 for generating a transfer gradient in the charge accumulation unit (MEM) 72 in FIG. 6 are laminated. Thus, it becomes possible to intensively provide terminals 81a to 83a on a column L2 (FIG. 5) including charge voltage conversion units (FD) 73 and pixel transistors (Tr.) 74 as illustrated in a part surrounded by a dotted line in FIG. 6. As a result, since it is not necessary to provide an opening for connecting the terminals 81a to 83a and a wiring line as indicated with the light shielding film 101, it becomes possible to enhance an effect of the light shielding film 101 and to reduce generation of a noise in the charge accumulation unit (MEM) 72.

Note that an example of using three electrodes in setting of a transfer gradient in the charge accumulation unit (MEM) 72 has been described in the above. However, the different number of electrodes may be used. Also, an example in which thicknesses of electrodes (gate length) are substantially even has been described as illustrated in FIG. 6. However, electrodes with uneven thickness (gate length) may be included. Here, a thickness of an electrode (gate length) may be decreased and the number of electrodes may be increased in a case where a transfer gradient is slightly insufficient. On the other hand, a thickness of an electrode may be increased and the number of electrodes may be decreased in a case where there is a margin in a transfer gradient.

As described above, since a transfer of a charge in a charge accumulation unit (MEM) 72 can be formed in the shortest distance in all directions according to a solid-state imaging element of the present technology, transfer efficiency can be improved.

Also, it becomes possible to separately arrange a column of photoelectric conversion units (PD) 71 and a column including charge voltage conversion units (FD) and pixel transistors (pixel Tr.) in parallel with each other in a case where pixels with the above-described configuration are arranged in an array. Thus, it becomes possible to simplify routing of a wiring line.

Furthermore, since the above-described structure in which a plurality of electrodes with a recess being provided at a center is laminated is included in a CIS, it becomes possible to bundle positions of taking out terminals in one direction. Thus, a degree of freedom in a layout of a light shielding film 101 provided on an upper layer of a charge accumulation unit (MEM) 72 is improved, and generation of a noise can be reduced by secure shielding of the charge accumulation unit (MEM) 72.

<Example of Application to Electronic Device>

The above-described solid-state imaging element can be applied to various electronic devices such as an imaging device such as a digital still camera or a digital video camera, a mobile phone having an imaging function, and a different device having an imaging function.

Figure 10:
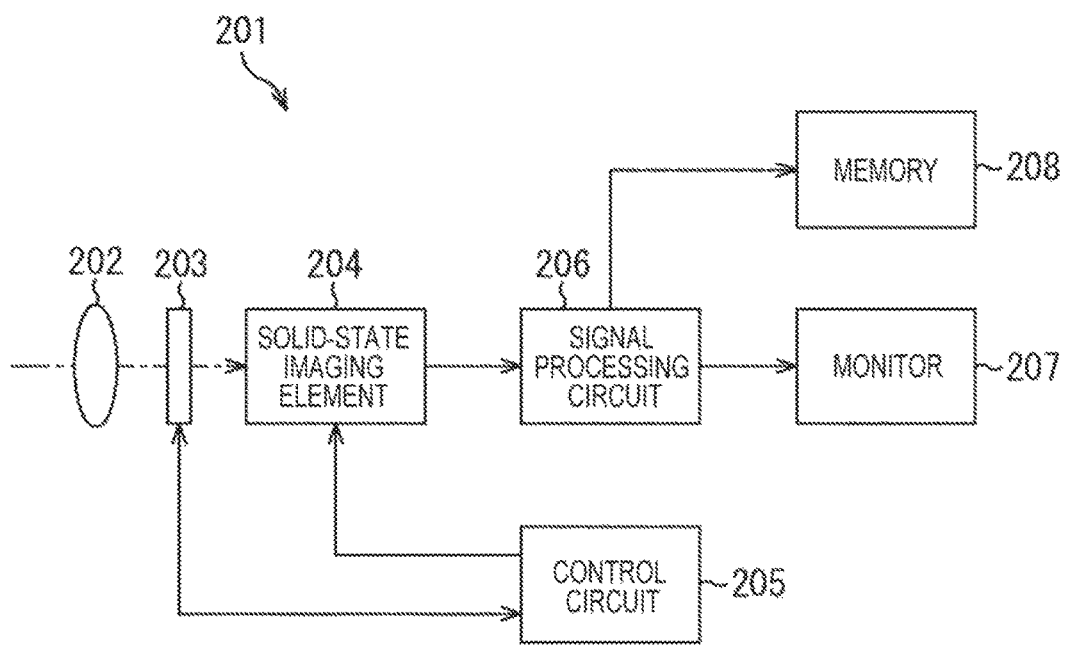
FIG. 10 is a block diagram for describing a configuration of an imaging device and an electronic device using a solid-state imaging element to which the present technology is applied.

FIG. 10 is a block diagram illustrating a configuration example of an imaging device as an electronic device to which the present technology is applied.

An imaging device 201 illustrated in FIG. 10 includes an optical system 202, a shutter device 203, a solid-state imaging element 204, a drive circuit 205, a signal processing circuit 206, a monitor 207, and a memory 208 and can image a still image and a moving image.

The optical system 202 includes one or a plurality of lenses, guides light (incident light) from a subject to the solid-state imaging element 204, and forms an image on a light receiving surface of the solid-state imaging element 204.

The shutter device 203 is arranged between the optical system 202 and the solid-state imaging element 204, and controls a light emitting period and a light blocking period with respect to the solid-state imaging element 204 under control by a drive circuit 1005.

The solid-state imaging element 204 includes a package including the above-described solid-state imaging element in FIG. 4 and FIG. 6. The solid-state imaging element 204 accumulates a signal charge for a certain period according to light formed on the light receiving surface via the optical system 202 and the shutter device 203. The signal charge accumulated in the solid-state imaging element 204 is transferred according to a drive signal (timing signal) supplied from the drive circuit 205.

The drive circuit 205 outputs a drive signal to control a transfer operation of the solid-state imaging element 204 and a shutter operation of the shutter device 203, and drives the solid-state imaging element 204 and the shutter device 203.

The signal processing circuit 206 performs various kinds of signal processing on the signal charge output from the solid-state imaging element 204. An image (image data) acquired by the signal processing by the signal processing circuit 206 is supplied to and displayed by the monitor 207 or is supplied to and stored (recorded) in the memory 208.

In the imaging device 201 configured in such a manner, it becomes also possible to realize imaging with a low noise in all pixels by application of the solid-state imaging element in FIG. 4 and FIG. 6 instead of the above-described solid-state imaging element 204.

<Example of Usage of Solid-State Imaging Element>

Figure 11:
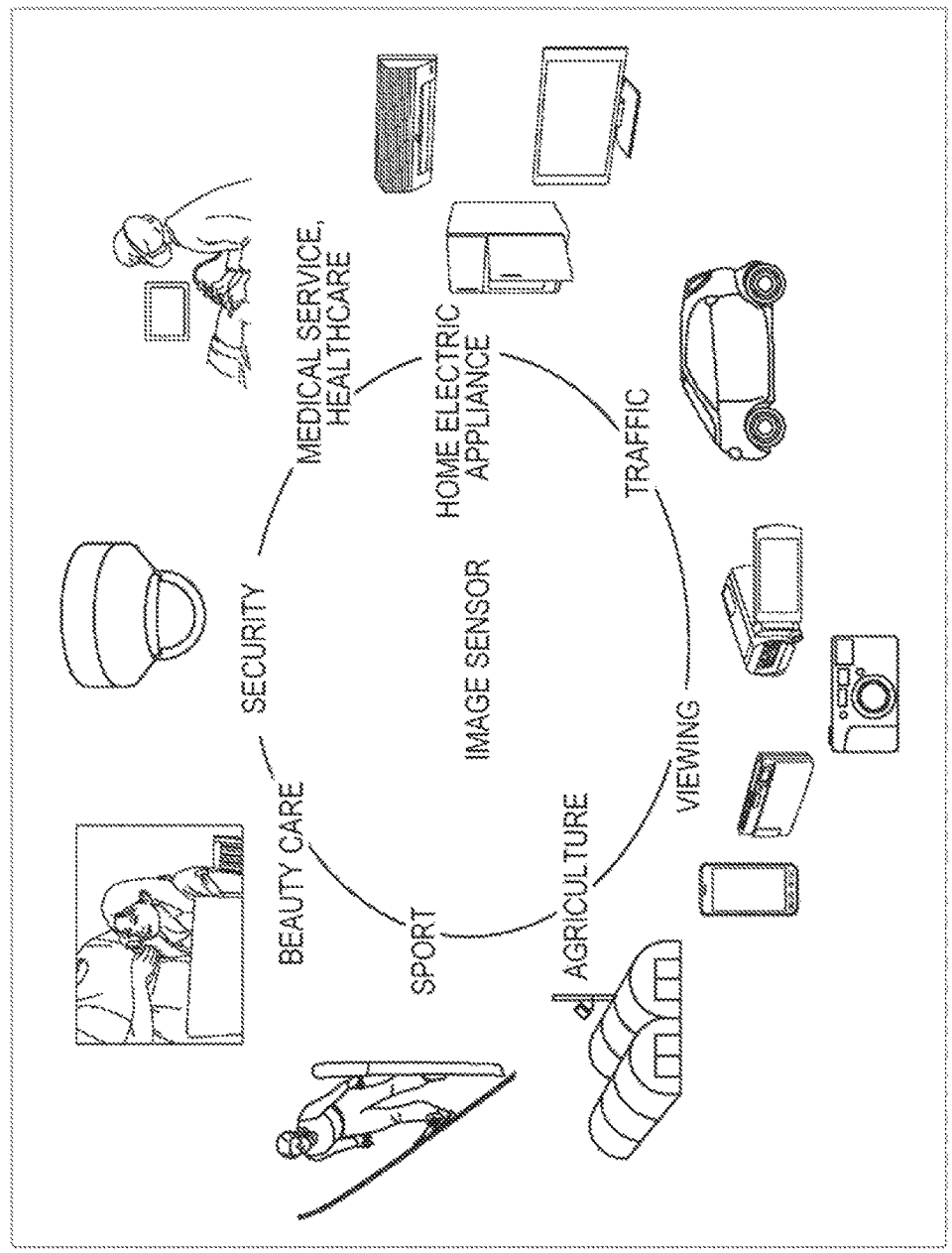
FIG. 11 is a view illustrating an example of usage of the solid-state imaging element.

FIG. 11 is a view illustrating an example of usage of the above-described solid-state imaging element in FIG. 4 and FIG. 6.

As described in the following, the above-described solid-state imaging element in FIG. 4 and FIG. 6 can be used in various cases of sensing light such as visible light, infrared light, ultraviolet light, or an X-ray.

A device of photographing an image which device is used for viewing and is, for example, a digital camera, or a mobile device with a camera function.

A device that is used for traffic and that is, for example, an in-vehicle sensor that photographs a front side, a back side, surroundings, or the inside of a car for safe driving such as automatic stopping or for recognition of a state of a driver, a monitoring camera that monitors a driving vehicle or a road, or a ranging sensor that measures a distance between vehicles.

A device used for a home electric appliance such as a TV, a refrigerator, or an air conditioner in order to photograph a gesture of a user and to perform a device operation corresponding to the gesture.

A device, which is used for a medical service or a health care, such as an endoscope or a device that photographs a blood vessel by reception of infrared light.

A device, which is used for security, such as a monitoring camera for crime prevention or a camera for recognizing a person.

A device, which is used for a beauty care, such as a skin measuring instrument that photographs skin or a microscope that photographs a scalp.

A device, which is used for a sport, such as an action camera or a wearable camera for a sport.

A device, which is used for agriculture, such as a camera for monitoring a state of a farm or a crop.

Note that the present technology may include the following configuration.

(1) A solid-state imaging element including:
a pixel including
a photoelectric conversion unit that generates a charge by photoelectric conversion according to an amount of incident light,
a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

(2) The solid-state imaging element according to (1), further including a plurality of electrodes that forms a transfer gradient to transfer the charge accumulated in the charge accumulation unit, in which a recess is provided at a center of each of the plurality of electrodes in such a manner as to face the charge voltage conversion unit, an electrode in an outermost periphery being formed in such a manner as to surround, in the recess, a different electrode smaller than the electrode in the outermost periphery, the different electrode being formed in such a manner as to surround, in the recess, a different electrode smaller than the different electrode, and an electrode connected to the charge voltage conversion unit being formed in the recess of the smallest electrode.

(3) The solid-state imaging element according to (2), in which thicknesses of the plurality of electrodes are even.

(4) The solid-state imaging element according to (2), in which thicknesses of the plurality of electrodes are uneven.

(5) The solid-state imaging element according to (4), in which the plurality of electrodes is configured with a small number of thick electrodes as a margin in the transfer gradient in the charge accumulation unit becomes large, and is configured with a large number of thin electrodes as the transfer gradient becomes insufficient.

(6) An imaging device including:

a pixel including a photoelectric conversion unit that generates a charge by photoelectric conversion according to an amount of incident light, a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

(7) An electronic device including:

a pixel including a photoelectric conversion unit that generates a charge by photoelectric conversion according to an amount of incident light, a charge accumulation unit that accumulates the charge generated by the photoelectric conversion unit, a charge voltage conversion unit that converts the charge accumulated in the charge accumulation unit into voltage, and a pixel transistor that outputs a pixel signal on the basis of the voltage converted by the charge voltage conversion unit, in which in a case where the charge voltage conversion unit is connected to a center of the charge accumulation unit and pixels are arrayed in an array, a column including photoelectric conversion units and a column including voltage conversion units and pixel transistors are formed in parallel.

REFERENCE SIGNS LIST 51, 51-1 to 51-9 Pixel
71 Photoelectric conversion unit (PD)
72 Charge accumulation unit (MEM)
73 Charge voltage conversion unit (FD)
74 Pixel transistor (pixel Tr.)
81 to 83 Electrode
84 Transfer transistor
81a to 84a, 81a-1 to 84a-1, 81a-2 to 84a-2 Terminal
101, 111 Light shielding film
111a, 111a-1 to 111a-4 Opening

The invention claimed is:

1. A solid-state imaging element, comprising:
   a pixel array comprising a plurality of pixels,
      wherein each pixel of the plurality of pixels comprises:
         a photoelectric conversion region configured to generate a charge by photoelectric conversion based on an amount of incident light;
         a charge accumulation region configured to accumulate the charge generated by the photoelectric conversion region;
         a charge voltage conversion region configured to convert the accumulated charge into a voltage; and
         a pixel transistor configured to output a pixel signal based on the voltage converted by the charge voltage conversion region,
      wherein, in a first direction, a first pitch of photoelectric conversion regions of the plurality of pixels is shifted from a second pitch of charge accumulation regions of the plurality of pixels by a substantially half pitch.

2. The solid-state imaging element according to claim 1, further comprising:
   a plurality of electrodes configured to form a transfer gradient to transfer the charge accumulated in the charge accumulation region,
   wherein a plurality of connection terminals associated with the plurality of electrodes are in a column of the pixel array, and the column comprises the charge voltage conversion region and the pixel transistor.

3. The solid-state imaging element according to claim 2, wherein a recess is at a center of each electrode of the plurality of electrodes, and the recess faces the charge voltage conversion region.

4. The solid-state imaging element according to claim 3,
   wherein a first electrode, of the plurality of electrodes, in an outermost periphery of the charge accumulation region surrounds a second electrode of the plurality of electrodes which is smaller than the first electrode,
   wherein the second electrode surrounds a third electrode of the plurality of electrodes which is smaller than the second electrode, and
   wherein a fourth electrode connected to the charge voltage conversion region is in the recess of the third electrode.

5. The solid-state imaging element according to claim 2, wherein thicknesses of the plurality of electrodes are same.

6. The solid-state imaging element according to claim 2, wherein thicknesses of the plurality of electrodes are different.

7. The solid-state imaging element according to claim 2, wherein at least one of a number of thick electrodes of the plurality of electrodes or a number of thin electrodes of the plurality of electrodes is based on the transfer gradient in the charge accumulation region.

8. The solid-state imaging element according to claim 1, wherein the charge voltage conversion region is connected to a center of the charge accumulation region,
wherein a first column of the pixel array comprises the photoelectric conversion regions and a second column of the pixel array comprises a plurality of voltage conversion regions and a plurality of pixel transistors, and
wherein the first column and the second column are non-overlapped.

9. An imaging device, comprising:
a pixel array comprising a plurality of pixels,
  wherein each pixel of the plurality of pixels comprises:
    a photoelectric conversion region configured to generate a charge by photoelectric conversion based on an amount of incident light;
    a charge accumulation region configured to accumulate the charge generated by the photoelectric conversion region;
    a charge voltage conversion region configured to convert the accumulated charge into a voltage; and
    a pixel transistor configured to output a pixel signal based on the voltage converted by the charge voltage conversion region,
  wherein, in a first direction, a first pitch of photoelectric conversion regions of the plurality of pixels is shifted from a second pitch of charge accumulation regions of the plurality of pixels by a substantially half pitch.

10. An electronic device, comprising:
a pixel array comprising a plurality of pixels,
  wherein each pixel of the plurality of pixels comprises:
    a photoelectric conversion region configured to generate a charge by photoelectric conversion based on an amount of incident light;
    a charge accumulation region configured to accumulate the charge generated by the photoelectric conversion region;
    a charge voltage conversion region configured to convert the accumulated charge into a voltage; and
    a pixel transistor configured to output a pixel signal based on the voltage converted by the charge voltage conversion region,
  wherein, in a first direction, a first pitch of photoelectric conversion regions of the plurality of pixels is shifted from a second pitch of charge accumulation regions of the plurality of pixels by a substantially half pitch.

* * * * *